United States Patent
Dong (10) Patent No.: US 12,411,423 B2
(45) Date of Patent: Sep. 9, 2025

(54) DEVELOPING DEVICE AND DEVELOPING METHOD

(71) Applicant: CHANGXIN MEMORY TECHNOLOGIES, INC., Hefei (CN)

(72) Inventor: Peng Dong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 958 days.

(21) Appl. No.: 17/455,705

(22) Filed: Nov. 19, 2021

(65) Prior Publication Data
US 2022/0075278 A1 Mar. 10, 2022

Related U.S. Application Data (63) Continuation of application No. PCT/CN2021/096008, filed on May 26, 2021.

(30) Foreign Application Priority Data

Jun. 8, 2020 (CN) .......................... 202110510877.0

(51) Int. Cl.
G03F 7/00 (2006.01)
G03F 7/30 (2006.01)

(52) U.S. Cl.
CPC ............ *G03F 7/70875* (2013.01); *G03F 7/30* (2013.01)

(58) Field of Classification Search
CPC ...... G03F 7/70875; G03F 7/30; G03F 7/3071; G03F 7/3057; G03F 7/3021; H01L 21/67;
(Continued)

(56) References Cited

U.S. PATENT DOCUMENTS 7,338,223 B2 * 3/2008 Ito .................... H01L 21/6875
396/611
9,195,138 B2 * 11/2015 Sasagawa ........... H01L 21/6715
(Continued)

FOREIGN PATENT DOCUMENTS

CN 1428658 A 7/2003
CN 103811383 A 5/2014
(Continued)

OTHER PUBLICATIONS

International Search Report as cited in PCT Application No. PCT/CN2021/096008 mailed Aug. 3, 2021, 9 pages.
(Continued)

*Primary Examiner* — Hung V Nguyen
(74) *Attorney, Agent, or Firm* — Kilpatrick Townsend & Stockton LLP (57) ABSTRACT

The developing device comprises: a development chamber that is provided with an air extraction pipeline for extracting air inside the development chamber to outside the development chamber; a carrier that is disposed in the development chamber for supporting a wafer; a plurality of temperature sensors that are disposed on the carrier for detecting temperatures of a plurality of target regions; a plurality of mutually independent air supply pipelines for supplying air to the development chamber, each of the target regions corresponding to at least one air supply pipeline; and a control unit for acquiring measured temperatures of the temperature sensors and calculating current temperatures of the corresponding target regions, and basing on the current temperatures of the target regions to adjust air parameters of the corresponding air supply pipelines, so that the temperatures of the corresponding target regions rest within a preset temperature range.

9 Claims, 4 Drawing Sheets

(58) Field of Classification Search
CPC ......... H01L 21/67017; H01L 21/67109; H01L 21/67248; H01L 21/67253
See application file for complete search history.

(56) References Cited

U.S. PATENT DOCUMENTS

| | | | |
|---|---|---|---|
| 11,390,945 B2* | 7/2022 | Jun .................. | C23C 16/52 |
| 12,123,778 B2* | 10/2024 | Carcasi ............ | H01L 21/6708 |
| 2003/0102385 A1 | 6/2003 | Nguyen | |
| 2020/0161146 A1* | 5/2020 | Goldberg ......... | H01L 21/67326 |

FOREIGN PATENT DOCUMENTS

| | | |
|---|---|---|
| CN | 104078301 A | 10/2014 |
| CN | 207637760 U | 7/2018 |
| CN | 109309033 A | 2/2019 |
| JP | 2002343696 A | 11/2002 |
| JP | 2013195905 A | 9/2013 |
| WO | 2019168662 A1 | 9/2019 |

OTHER PUBLICATIONS

Written Opinion cited in PCT/CN2021/096008, mailed on Aug. 3, 2021, 7 pages.
First Office Action of the Chinese application No. 202010510877.0, issued on May 29, 2023. 8 pages with English translation.

* cited by examiner

DEVELOPING DEVICE AND DEVELOPING METHOD

CROSS-REFERENCE TO RELATED APPLICATIONS

This application is a continuation application of International Patent Application No. PCT/CN2021/096008, filed on May 26, 2021, which claims the right of priority to Chinese Patent Application No. 202010510877.0, filed before the Chinese Patent Office on Jun. 8, 2020 and entitled "Developing Device and Developing Method". The entire contents of International Patent Application No. PCT/CN2021/096008 and Chinese Patent Application No. 202010510877.0 are herein incorporated by reference.

TECHNICAL FIELD

The present application relates to the field of semiconductor fabrication techniques, and more particularly to a developing device and a developing method.

BACKGROUND

In semiconductor fabrication is usually involved a developing operation on photoresist in the manufacturing process. When a wafer is placed on a carrier of the development chamber to be developed there, it is necessary to extract air in real time, so as to timely extract the air produced in the developing process. At present, it is modus operandi to dispose an air supply pipeline right above the wafer and to dispose an air extraction pipeline at the bottom of the development chamber, of which the air supply pipeline is continuously aligned with the wafer to supply air, and the air extraction pipeline continuously extracts the air in the chamber to the outside of the chamber. In the process of air extraction, since the flow rates of the air flowing through various regions on the surface of the wafer are not consistent, evaporation rates at the surface of the wafer are also different, and the temperature at the surface of the wafer changes by gradients, while development rates under different temperatures are different, thereby affecting uniformity of the actual pattern sizes.

SUMMARY

In view of the above technical problem, the present application proposes a developing device and a developing method based on the developing device.

The developing device comprises:
a development chamber, provided with an air extraction pipeline for extracting air inside the development chamber to outside the development chamber;
a carrier, disposed in the development chamber, for supporting a wafer;
a plurality of temperature sensors, disposed on the carrier, for detecting temperatures of a plurality of target regions;
a plurality of mutually independent air supply pipelines, for supplying air to the development chamber, each air supply pipeline having a nozzle towards the carrier, each of the target regions corresponding to at least one air supply pipeline; and
a control unit, for acquiring measured temperatures of the temperature sensors and basing on the measured temperatures to calculate current temperatures of the corresponding target regions, and basing on the current temperatures of the target regions to adjust air parameters of the corresponding air supply pipelines, so that the temperatures of the corresponding target regions rest within a preset temperature range.

A developing method, which develops on the basis of the aforementioned developing device, and comprises:
pouring a developer onto a carrier and placing a wafer surface-coated with photoresist on the carrier;
ejecting airflows to surface of the wafer through a plurality of air supply pipelines, and extracting air inside a development chamber to outside the development chamber through an air extraction pipeline in real time; and
detecting temperatures of different target regions through temperature sensors on the carrier, acquiring measured temperatures of the temperature sensors and basing on the measured temperatures to calculate current temperatures of corresponding target regions, and basing on the current temperatures of the target regions to adjust air parameters of the corresponding air supply pipelines, so that the temperatures of the corresponding target regions rest within a preset temperature range.

NOTES ON REFERENCE NUMERALS

100: development chamber
110: air extraction pipeline
120: ventilation screen
200: carrier
210: temperature sensor
300: turntable
310: through-hole
400: nozzle
410: temperature regulator
500: control unit
201: first target region
202: second target region
203: third target region
204: fourth target region
301: first air-blowing region
302: second air-blowing region
303: third air-blowing region
304: fourth air-blowing region 411: pipeline housing
412: heating module
413: temperature monitor/control module

DESCRIPTION OF EMBODIMENTS

To facilitate understanding of the present application, the present application will be described more comprehensively below with reference to the accompanying drawings. The accompanying drawings illustrate the most preferred embodiments of the present application. However, the present application can be implemented by many different modes, and are not restricted to the embodiments herein described. To the contrary, the objective for providing these embodiments is to make the contents published by the present application more thorough and comprehensive.

Unless otherwise defined, all technical and scientific terms used throughout the context are identical in meanings as they are usually understood by persons skilled in the art. Such terms as used in the Description of the present application are merely for the purpose of describing specific embodiments, and are not meant to restrict the present application. The wording " . . . and/or . . . " used in this context means the random and all combination(s) of one or more relevantly listed item(s).

Figure 1:
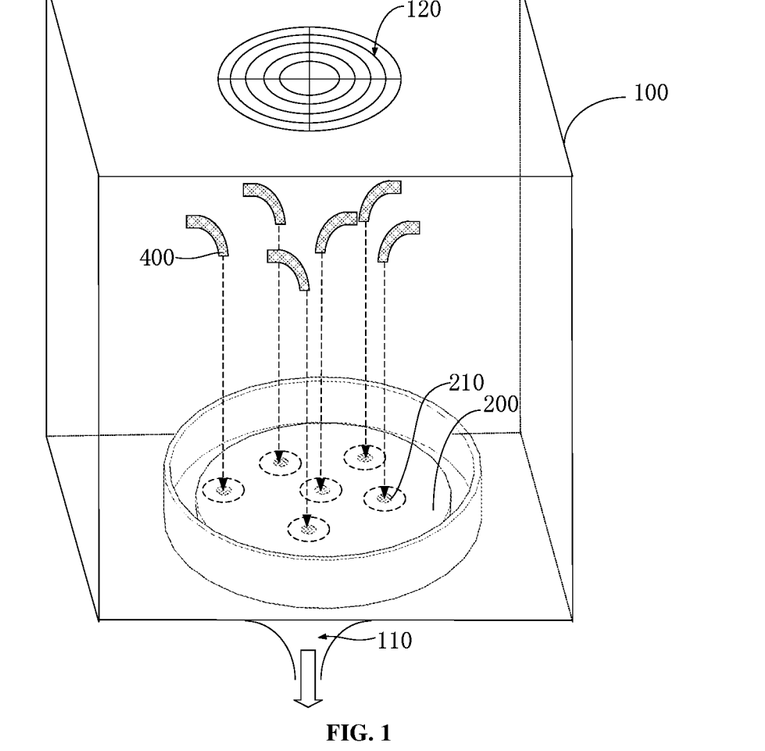
In FIG. 1 is a three-dimensional diagram schematically illustrating the structure of the developing device according to an embodiment.

As shown in FIG. 1, the developing device comprises:
- a development chamber 100, provided with an air extraction pipeline 110 for extracting air inside the development chamber 100 to outside the development chamber 100;
- a carrier 200, disposed in the development chamber 100, for supporting a wafer;
- a plurality of temperature sensors 210, disposed on the carrier 200, specifically on an upper surface of the carrier 200, for detecting temperatures of a plurality of target regions (as shown by dotted lines in FIG. 1)—when a wafer is placed on the carrier 200, temperature sensors 210 can detect temperatures of plural target regions of the wafer;
- a plurality of mutually independent air supply pipelines, for supplying air to the development chamber 100, each air supply pipeline having a nozzle 400 towards the carrier 200, air being blown to the surface of the wafer on the carrier 200 through nozzles 400, each target region corresponding to at least one nozzle 400 of an air supply pipeline, and temperatures of corresponding target regions being adjustable by changing air parameters of the air supply pipelines. As should be noted, for the sake of clarity, in FIG. 1 are merely shown nozzles 400 of partial air supply pipelines. The shape and distribution of the tubings of the air supply pipelines behind the nozzles 400 can be adjusted as practically required, and no definition is made thereto in this context, as long as it is guaranteed that the nozzles 400 of the various air supply pipelines possess the aforementioned features.

Figure 2:
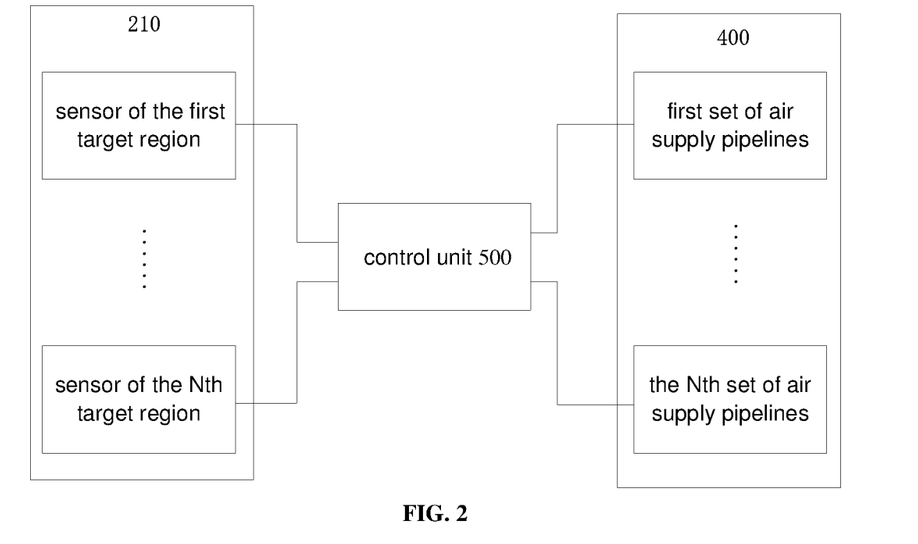
FIG. 2 is a diagram illustrating the relation of electrical connection among the control unit, the temperature sensors and the air supply pipelines according to an embodiment.

As shown in combination with FIG. 2, the developing device further comprises a control unit 500 connected to the various temperature sensors 210 and air supply pipelines respectively for acquiring measured temperatures of the temperature sensors 210 and calculating current temperatures of the corresponding target regions, and basing on the current temperatures of the target regions to adjust air parameters of the corresponding air supply pipelines, so that the temperatures of the corresponding target regions rest within a preset temperature range. In one embodiment, when the current temperature of a target region is higher than the preset temperature range, the air parameter of the corresponding air supply pipeline is adjusted to lower the temperature of this target region, until the temperature of this target region is lowered to be within the preset temperature range; when the temperature of a target region is lower than the preset temperature range, the air parameter of the corresponding air supply pipeline is adjusted to raise the temperature of this target region, until the temperature of this target region is raised to be within the preset temperature range. For instance, on the carrier are divided the first to the Nth target regions, each target region is provided with at least one temperature sensor, each target region corresponds to one corresponding set of air supply pipelines, each set of air supply pipelines includes at least one air supply pipeline, the first target region corresponds to the first set of air supply pipelines, the second target region corresponds to the second set of air supply pipelines, so on so forth, and the Nth target region corresponds to the Nth set of air supply pipelines. When the current temperature of the Nth target region exceeds the preset temperature range, the control unit 500 controls the air parameter of the Nth set of air supply pipelines, until the temperature of the Nth target region resumes to be within the preset temperature range.

In the aforementioned developing device, temperature sensors 210 are provided to different target regions on the carrier 200, when a wafer is placed on the carrier 200, temperatures of plural regions of the wafer can be monitored and controlled via the temperature sensors 210. At the same time, plural mutually independent air supply pipelines are disposed above the carrier 200, nozzles 400 of the air supply pipelines are directed right to the carrier 200 to blow air thereto, each target region corresponds to at least one air supply pipeline, and wafer temperatures of corresponding target regions can be adjusted by adjusting air parameters of the air supply pipelines. The control unit 500 is connected to the various temperature sensors 210 and air supply pipelines respectively for acquiring measured temperatures of the temperature sensors 210 and calculating current temperatures of the target regions on the basis of the measured temperatures, and then basing on the current temperatures of the target regions to adjust air parameters of the corresponding air supply pipelines, so that the measured temperatures of the corresponding temperature sensors 210 resume to be within a preset temperature range. When the current temperature of a target region is higher than the preset temperature range, the air parameter of the corresponding air supply pipeline is adjusted to lower the temperature of this target region, until the temperature of this target region is lowered to be within the preset temperature range; when the temperature of a target region is lower than the preset temperature range, the air parameter of the corresponding air supply pipeline is adjusted to raise the temperature of this target region, until the temperature of this target region is raised to be within the preset temperature range, whereby temperatures of the various regions of the wafer rest only within the preset range, and it is avoided that temperature differences among the various regions of the wafer should be unduly large, thereby ensuring uniformity of etching line widths.

In one embodiment, as shown in FIG. 1, the air extraction pipeline 110 is disposed at the bottom surface of the development chamber 100, the carrier 200 is disposed at the bottom of the development chamber 100 and above the air extraction pipeline 110, when nozzles 400 of the air supply pipelines above the carrier 200 blow air to the carrier 200, it is ensured that airflow is blown up to down towards the surface of the wafer. In one embodiment, on the top of the development chamber 100 is further provided a ventilation screen 120. In one embodiment, the various nozzles 400 are directed right to the upper surface of the carrier 200, the airs ejected out of the nozzles 400 are blown perpendicularly down to the surface of the wafer, whereby is made possible to better adjust temperatures of the corresponding target regions. In one embodiment, the temperature sensors 210 are uniformly distributed on the carrier 200, each temperature sensor 210 corresponds to one target region, each target region corresponds to a nozzle 400 of one air supply pipeline, and wafer temperatures of the target regions in which the various temperature sensors 210 are located are adjusted through the plurality of air supply pipelines, whereby temperature distribution on the entire surface of the wafer is made more uniform. In other embodiments, in one target region can be provided plural temperature sensors 210, an average temperature of the plural temperature sensors 210 is calculated to serve as the temperature of the corresponding target region, one temperature region can correspond to the nozzles 400 of plural air supply pipelines, and the temperature of the same and single target region is adjusted through plural nozzles 400 together.

In one embodiment, the aforementioned adjustment of air parameters of the air supply pipelines can be the adjustment of flow rates of airs and temperatures of airs; the greater the flow rate of an air is, the quicker will be the evaporation rate of liquid on the wafer surface, and the lower will be the temperature of the corresponding region; the lower the temperature of an air is, the greater will be the temperature difference between the air and the wafer surface, the quicker will be heat conduction, and the lower will be the wafer temperature of the corresponding region. In this embodiment, it is possible to equalize the flow rates of airs flowing from the nozzles 400 to the wafer surface, while adjustment is only made on the air temperatures. In other embodiments, it is as well possible to only adjust air flow rates or to simultaneously adjust air flow rates and air temperatures.

Figure 3:
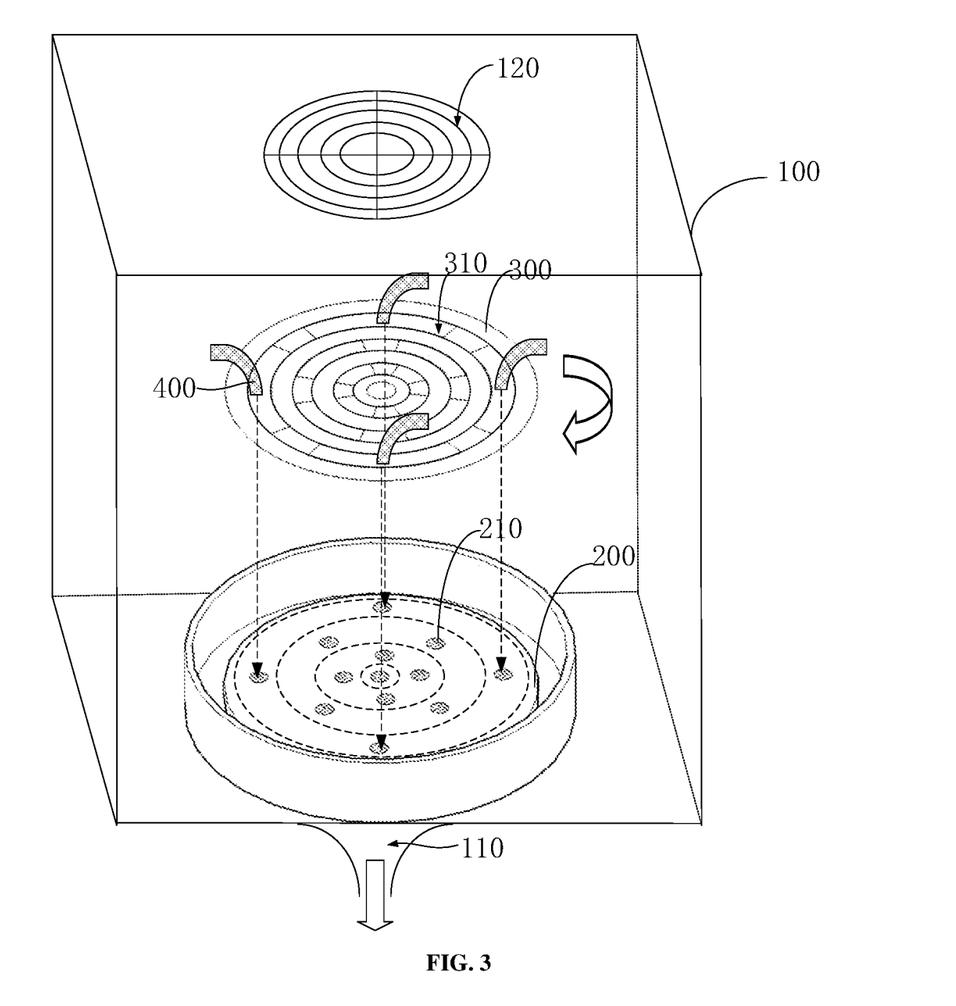
FIG. 3 is a three-dimensional diagram schematically illustrating the structure of the developing device with a turntable added according to another embodiment.
Figure 4:
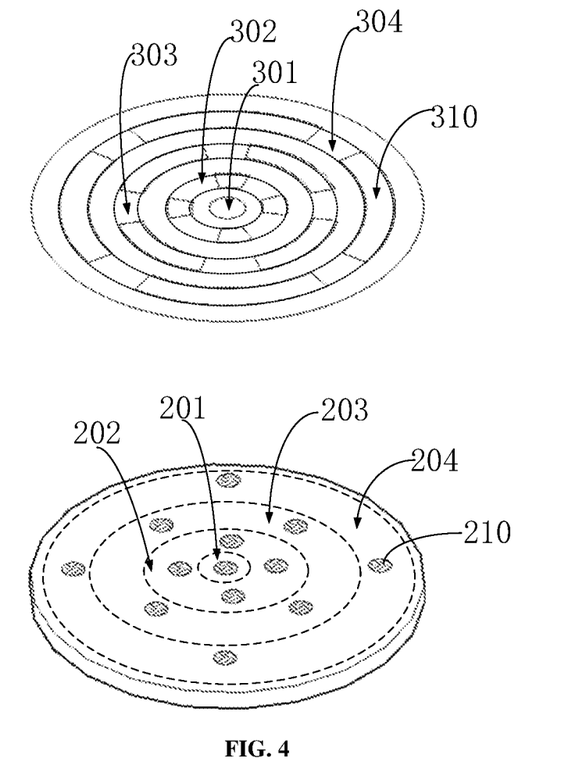
FIG. 4 is a diagram illustrating the corresponding relation between target regions and air-blowing regions according to an embodiment.

In one embodiment, as shown in FIGS. 3 and 4, the carrier 200 has a plurality of target regions in the shape of concentric rings, each target region in the shape of concentric ring is provided therein with a plurality of temperature sensors 210, and the control unit 500 is employed to acquire measured temperatures of the temperature sensors in the target region and calculate an average temperature of all temperature sensors in the target region to serve as the current temperature of the corresponding target region. In one embodiment, the temperature sensors 210 in a target region in the shape of concentric ring are uniformly distributed. The number of the temperature sensors disposed in a single target region in the shape of concentric ring can be flexibly selected, in this embodiment, the number of the temperature sensors 210 in a target region can be greater than or equal to four—the more the number of temperature sensors 210 is, the more precise will be calculated and obtained the temperature of the target region. The aforementioned developing device further comprises a turntable 300 disposed between the carrier 200 and nozzles 400 of the air supply pipelines, that is to say, the turntable 300 is located above the carrier 200 and below the nozzles 400 of the various air supply pipelines. In one embodiment, the turntable 300 is in a plane that is parallel to the upper surface of the carrier 200. The turntable 300 has a plurality of air-blowing regions in the shape of concentric rings, the air-blowing regions correspond to the target regions on a one-by-one basis to blow air to corresponding target regions, each air-blowing region in the shape of concentric ring is opened with a plurality of uniformly distributed through-holes 310, and above each air-blowing region in the shape of concentric ring are provided a plurality of uniformly distributed nozzles 400. For the sake of clarity, FIG. 3 merely shows nozzles 400 above just one air-blowing region in the shape of concentric ring, as understandable, other air-blowing regions are also provided with nozzles. The turntable 300 is rotatable within a plane parallel to the upper surface of the carrier 200, and the through-holes 310 allow airflows of the nozzles 400 to pass during the rotation process. In this embodiment, below the nozzles 400 is provided a turntable 300 with through-holes 310, and the through-holes 310 are distributed in the shape of concentric rings, thus facilitating control of the airflows of the nozzles to rotate and to be sent to the corresponding target regions in the shape of concentric rings; moreover, flow rates of airflows throughout the same and single target region are essentially the same, and it suffices to adjust the air temperatures in the air supply pipelines during the development process in order to ensure that temperatures of various regions of the wafer are uniform.

The above configuration is exemplarily described with reference to FIG. 4. The carrier 200 is divided, from the inside out, into a first target region 201, a second target region 202, a third target region 203, and a fourth target region 204. Of which the first target region 201 is located in a central position of the carrier 200 and assumes a round shape, and the second target region 202, the third target region 203, and the fourth target region 204 are respectively assume the shape of concentric rings. The turntable 300 is divided, from the inside out, into a first air-blowing region 301, a second air-blowing region 302, a third air-blowing region 303, and a fourth air-blowing region 304. The first air-blowing region 301 is located in a central position of the turntable 300 and assumes a round shape, and the second air-blowing region 302, the third air-blowing region 303, and the fourth air-blowing region 304 are respectively assume the shape of concentric rings. The first air-blowing region 301 corresponds to the first target region 201, the second air-blowing region 302 corresponds to the second target region 202, the third air-blowing region 303 corresponds to the third target region 203, and the fourth air-blowing region 304 corresponds to the fourth target region 204. On the turntable 300, each air-blowing region is opened with a plurality of uniformly distributed through-holes 310, and above each air-blowing region are provided a plurality of uniformly distributed nozzles 400. The nozzles above the fourth air-blowing region 304 blow airs to the fourth target region 204 through the through-holes 310 above the fourth air-blowing region, the nozzles 400 above the third air-blowing region 303 blow airs to the third target region 203 through the through-holes 310 above the third air-blowing region 303, the nozzles 400 above the second air-blowing region 302 blow airs to the second target region 202 through the through-holes 310 above the second air-blowing region 302, and the nozzles 400 above the first air-blowing region 301 blow airs to the first target region 201 through the through-holes 310 above the first air-blowing region 301. As should be noted, the aforementioned first to fourth air-blowing regions are merely described by way of example, and the temperature sensors 210 and the through-holes 310 can be respectively formed as more concentric rings. In this embodiment, since the turntable 300 should be rotated during operation, the through-holes 310 on the turntable 300 are distributed in the shape of concentric rings, and the temperature sensors 210 on the carrier 200 are also distributed in the shape of concentric rings, whereby it can be guaranteed that, during the process of rotation, airflows at different positions are allowed to pass when the through-holes 310 are rotated to different positions, and this in turn guarantees that the airflows above the turntable 300 are blown to the wafer surface insofar as possible through the through-holes 310.

In one embodiment, the various nozzles 400 are within the same plane that is parallel to the upper surface of the carrier 200, that is to say, the distances between the various nozzles 400 and the turntable 300 are identical, and the turntable 300 is located below the nozzles 400 and abuts against the nozzles 400, for instance, the distances between the nozzles 400 and the turntable 300 are less than 1 cm. Abutting the nozzles 400 against the turntable 300 makes it possible to guarantee that more airflows ejected from more nozzles 400 pass through the through-holes 310 and arrive at the wafer surface, thus achieving a better control effect.

Figure 5:
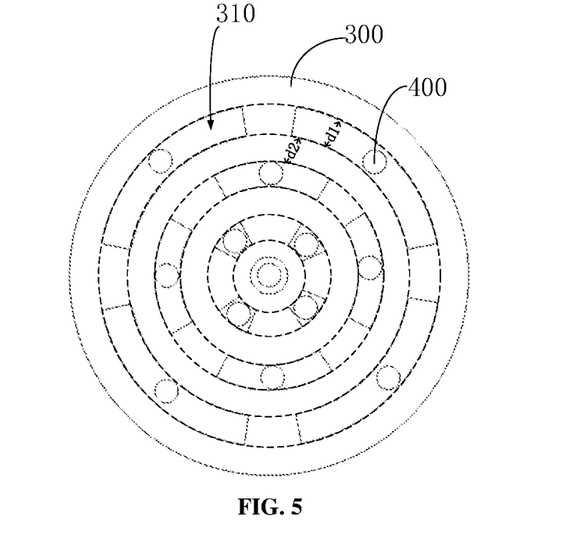
FIG. 5 is a diagram illustrating the corresponding relation between turntable through-holes and nozzles according to an embodiment.

In one embodiment, as shown in FIGS. 4 and 5, the air-blowing regions in the shape of concentric rings are opened with the same number of through-holes 310; in one embodiment, each air-blowing region in the shape of concentric ring is opened with four uniformly distributed through-holes. In one embodiment, each through-hole corresponds to one nozzle 400 of an air supply pipeline. In other embodiments, the number of through-holes opened in each single air-blowing region may also be a different number, as long as it is guaranteed that the number of through-holes in the single air-blowing region in the shape of concentric ring is greater than or equal to two, whereby is guaranteed that flow rates of airflows supplied to the same target region are identical.

In one embodiment, as shown by a combination of FIG. 4 with FIG. 5, length of the single through-hole 310 increases with increase of ring diameter of the corresponding air-blowing region in the shape of concentric ring. Since the internal diameter of the concentric ring near the periphery of the turntable 300 is relatively large, the length of a single through-hole 310 is increased, and the through-hole 310 is configured as strip-shaped, then the area of the through-hole 310 can be increased, so that more airflows above the turntable 300 will be blown through the turntable 300 to the wafer surface.

In one embodiment, as shown in FIG. 5, widths d1 of the various through-holes 310 are identical. In one embodiment, widths of the through-holes 310 are equal to widths of the corresponding air-blowing regions, that is to say, the through-holes 310 are themselves distributed in the shape of concentric rings, and distances d2 among adjacent air-blowing regions are identical. In one embodiment, d1=d2. In one embodiment, 18 mm≤d1≤22 mm. In this embodiment, d1=20 mm. In one embodiment, as shown in FIG. 5, numbers of through-holes 310 on the various air-blowing regions in the shape of concentric rings are identical, and lengths of through-holes 310 on the same concentric ring are identical. As should be noted, the numbers and distribution modes of the through-holes 310 are not restricted to what is described above, and the through-holes 310 can also be distributed in other modes in other embodiments. In this embodiment, the mode of distributing the through-holes 310 on the turntable 300 is defined, and this mode can increase the areas of the through-holes 310 as large as possible and enable airflows ejected out of the nozzles 400 to be blown to the wafer surface as far as possible on the one hand, and, on the other hand, also facilitate control of the flow rates of the airs arriving at the same target region of the wafer to be approaching the same during the rotation process of the turntable 300.

Figure 6:
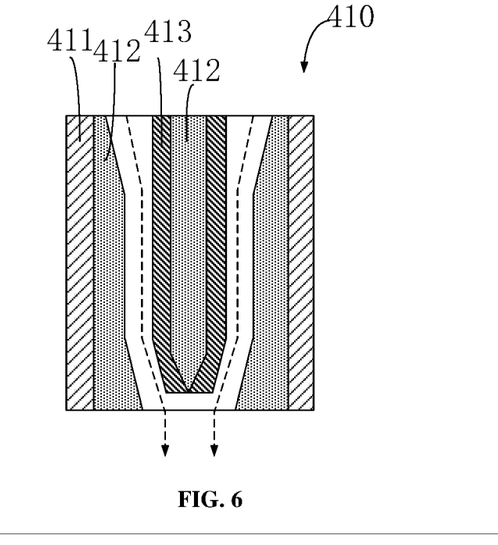
FIG. 6 is a diagram schematically illustrating the temperature regulator according to an embodiment.

In one embodiment, as shown in FIG. 6, a temperature regulator 410 is installed in the air supply pipeline, and the control unit 500 specifically changes air temperature in the corresponding air supply pipeline by controlling the temperature of the temperature regulator 410, so as to adjust the wafer temperature of the region in which a corresponding temperature sensor 210 is located. In one embodiment, the temperature regulator 410 includes a pipeline housing 411, and a heating module 412 and a temperature monitor/control module 413 in the pipeline, of which the heating module 412 is employed to heat passing airflows (as shown by dotted lines in FIG. 6), the temperature monitor/control module 413 is employed to monitor and control airflow temperature in the pipeline, the control unit 500 bases on the measured temperature fed back by a temperature sensor 210 to control the heating module 412 to raise or lower the temperature, the heating module 412 controls the airflow temperature of the corresponding air supply pipeline through heat conduction, and the current airflow temperature can be fed back in real time through the temperature monitor/control module 413.

In the aforementioned developing device, plural temperature sensors 210 are disposed on different regions of the carrier 200 to measure temperatures of different target regions, when a wafer is placed on the carrier 200, temperatures of the various target regions of the wafer can be monitored and controlled through the temperature sensors 210. At the same time, plural independent air supply pipelines are provided above the carrier 200, nozzles 400 of the air supply pipelines blow air right towards the carrier 200, each target region corresponds to at least one air supply pipeline, and wafer temperatures of the corresponding target regions can be adjusted by adjusting air parameters of the air supply pipelines. The control unit 500 is connected to the various temperature sensors 210 and the various air supply pipelines respectively to acquire measured temperatures of the various temperature sensors 210, to calculate current temperatures of the target regions according to the measured temperatures, and then to adjust air parameters of the corresponding air supply pipelines according to the current temperatures of the target regions, so as to enable the temperatures of the corresponding target regions to resume within a preset temperature range. When the current temperature of a target region is higher than the preset temperature range, the air parameter of the corresponding air supply pipeline is adjusted to lower the temperature of this target region, until the temperature of this target region is lowered to be within the preset temperature range; when the temperature of a target region is lower than the preset temperature range, the air parameter of the corresponding air supply pipeline is adjusted to raise the temperature of this target region, until the temperature of this target region is raised to be within the preset temperature range, whereby is guaranteed that temperatures of the various regions of the wafer rest only within the preset range, and it is avoided that temperature differences among the various regions of the wafer should be unduly large, thereby ensuring uniformity of etching line widths.

Figure 7:
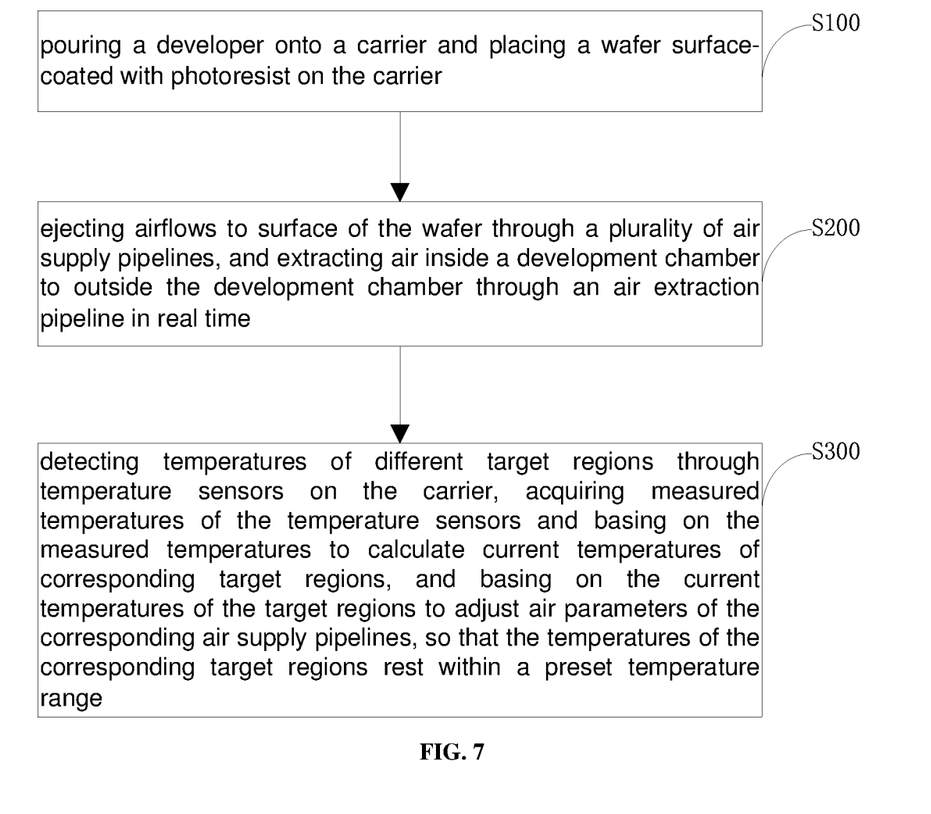
FIG. 7 is a flowchart illustrating the steps of the developing method according to an embodiment.

The present application further provides a developing method based on the aforementioned developing device, as shown in FIG. 7, the developing method comprises the following steps.

Step S100: pouring a developer onto a carrier and placing a wafer surface-coated with photoresist on the carrier.

Step S200: ejecting airflows to surface of the wafer through a plurality of air supply pipelines, and extracting air inside a development chamber to outside the development chamber through an air extraction pipeline in real time.

In one embodiment, when airflows are ejected to the surface of the wafer through a plurality of air supply pipelines, the airflow flow rates of the various air supply pipelines are so adjusted that air speed is identical throughout the wafer surface.

In one embodiment, between the carrier 200 and the nozzles 400 is further disposed a turntable 300, and the turntable 300 are provided thereon with through-holes 310 allowing airflows of the nozzles 400 to pass. During air extraction, the turntable 300 is controlled to be rotated within a plane parallel to the upper surface of the carrier 200, on the one hand, airflows of the nozzles 400 can be blown to the wafer surface through the through-holes 310, and on the other hand, air speed can be controlled to be identical throughout the various regions on the wafer surface by controlling the turntable 300 to be rotated.

Step S300: detecting temperatures of different target regions through temperature sensors on the carrier, acquiring measured temperatures of the temperature sensors and basing on the measured temperatures to calculate current temperatures of corresponding target regions, and basing on the current temperatures of the target regions to adjust air parameters of the corresponding air supply pipelines, so that the temperatures of the corresponding target regions rest within a preset temperature range.

In one embodiment, the aforementioned adjustment of air parameters of the air supply pipelines can specifically be the adjustment of flow rates of airs and temperatures of airs; the greater the flow rate of an air is, the quicker will be the evaporation rate of liquid on the wafer surface, and the lower will be the temperature of the corresponding region of the wafer; the lower the temperature of an air is, the greater will be the temperature difference between the air and the wafer surface, the quicker will be heat conduction, and the lower will be the wafer temperature of the corresponding region. In this embodiment, it is possible to equalize the flow rates of airs flowing from the nozzles 400 to the wafer surface, while adjustment is only made on the air temperatures to adjust the temperature of the wafer surface, i.e., the step of ejecting airflows to surface of the wafer through a plurality of air supply pipelines includes adjusting airflow flow rates of the air supply pipelines, so that air speed is identical throughout the surface of the wafer; and the step of basing on the measured temperatures to calculate current temperatures of corresponding target regions, and basing on the current temperatures of the target regions to adjust air parameters of the corresponding air supply pipelines, so that the temperatures of the corresponding target regions rest within a preset temperature range includes basing on the current temperatures of the target regions to adjust air temperatures of the corresponding air supply pipelines, so that the temperatures of the corresponding target regions rest within a preset temperature range. In other embodiments, it is as well possible to only adjust air flow rates or to simultaneously adjust air flow rates and air temperatures. In one embodiment, a temperature regulator 410 is installed in the air supply pipeline, and the above adjustment changes air temperature in the corresponding air supply pipeline by controlling the temperature of the temperature regulator 410, so as to adjust the wafer temperature of the region in which a corresponding temperature sensor 210 is located.

In one embodiment, the step of equalizing the flow rates of airs arriving at the various regions on the wafer surface and adjusting air parameters of the corresponding air supply pipelines so that the temperatures of the corresponding target regions rest within a preset temperature range includes basing on the current temperatures of the target regions to adjust air temperatures of the corresponding air supply pipelines so that the temperatures of the corresponding target regions rest within a preset temperature range.

As should be understood, although the various steps shown in the flowchart of FIG. 7 are sequentially illustrated according to arrow indications, these steps are NOT necessarily executed in the sequence according to the arrow indications. Unless explicitly explained in this context, the execution of these steps does not have to abide by a strict sequence, as they can also be executed by other sequences. Moreover, at least partial steps in FIG. 7 can include plural sub-steps or plural sub-phases, these sub-steps or sub-phases are not necessarily executed at the same timing, but they can be executed at different timings, and their execution is not necessarily according to sequence, as they can be executed in turns or alternatively with respect to at least part of other steps or sub-steps or sub-phases of other steps.

In the aforementioned developing method, plural temperature sensors 210 are disposed on different regions of the carrier 200 to measure temperatures of different target regions, when a wafer is placed on the carrier 200, temperatures of the various target regions of the wafer can be monitored and controlled through the temperature sensors 210. At the same time, plural independent air supply pipelines are provided above the carrier 200, nozzles 400 of the air supply pipelines blow air right towards the carrier 200, each target region corresponds to at least one air supply pipeline, and wafer temperatures of the corresponding target regions can be adjusted by adjusting air parameters of the air supply pipelines. The control unit 500 is connected to the various temperature sensors 210 and the various air supply pipelines respectively to acquire measured temperatures of the various temperature sensors 210, to calculate current temperatures of the target regions according to the measured temperatures, and then to adjust air parameters of the corresponding air supply pipelines according to the current temperatures of the target regions, so as to enable the temperatures of the corresponding target regions to resume within a preset temperature range. When the current temperature of a target region is higher than the preset temperature range, the air parameter of the corresponding air supply pipeline is adjusted to lower the temperature of this target region, until the temperature of this target region is lowered to be within the preset temperature range; when the temperature of a target region is lower than the preset temperature range, the air parameter of the corresponding air supply pipeline is adjusted to raise the temperature of this target region, until the temperature of this target region is raised to be within the preset temperature range, whereby is guaranteed that temperatures of the various regions of the wafer rest only within the preset range, and it is avoided that temperature differences among the various regions of the wafer should be unduly large, thereby ensuring uniformity of etching line widths.

The foregoing embodiments merely represent several modes of execution of the present application, they are described relatively in specifics and in detail, but they should not be therefore understood as restricting the scope of the present application. As should be noted, persons ordinarily skilled in the art may make various modifications and improvements without departing from the conception of the present application, and all such modifications and improvements shall fall within the protection scope of the present application. Accordingly, the protection scope of the present application shall base on the attached Claims.

What is claimed is:

1. A developing device, characterized in comprising:
a development chamber, provided with an air extraction pipeline for extracting air inside the development chamber to outside the development chamber;
a carrier, disposed in the development chamber, for supporting a wafer;
a plurality of temperature sensors, disposed on the carrier, for detecting temperatures of a plurality of target regions;
a plurality of mutually independent air supply pipelines, for supplying air to the development chamber, each air supply pipeline having a nozzle towards the carrier, each of the target regions corresponding to at least one air supply pipeline; and
a control unit, for acquiring measured temperatures of the temperature sensors and basing on the measured temperatures to calculate current temperatures of the corresponding target regions, and basing on the current temperatures of the target regions to adjust air parameters of the corresponding air supply pipelines, so that the temperatures of the corresponding target regions rest within a preset temperature range;
wherein the carrier has a plurality of target regions in the shape of concentric rings, each target region in the shape of concentric ring is provided therein with a plurality of uniformly distributed temperature sensors, and the control unit is employed to acquire measured temperatures of the temperature sensors in the target region and calculate an average temperature of all temperature sensors in the target region to serve as the current temperature of the corresponding target region;
the developing device further comprising:
a turntable, disposed between the carrier and all nozzles, the turntable having a plurality of air-blowing regions in the shape of concentric rings, the air-blowing regions corresponding to the target regions on a one-by-one basis to blow air to corresponding target regions, each air-blowing region in the shape of concentric ring being opened with a plurality of uniformly distributed through-holes, above each air-blowing region in the shape of concentric ring being provided a plurality of uniformly distributed nozzles, the turntable being rotatable within a plane parallel to the carrier, and the through-holes allowing airflows of the nozzles to pass during rotation process.

2. The developing device according to claim 1, wherein the nozzles are within the same and single plane parallel to an upper surface of the carrier, and the turntable is located below and abuts against the nozzles.

3. The developing device according to claim 1, wherein the air-blowing regions in the shape of concentric rings are opened with the same number of through-holes.

4. The developing device according to claim 3, wherein each air-blowing region in the shape of concentric ring is opened with four uniformly distributed through-holes, and each through-hole corresponds to one nozzle.

5. The developing device according to claim 3, wherein length of a single through-hole increases with increase of ring diameter of the corresponding air-blowing region in the shape of concentric ring.

6. The developing device according to claim 1, wherein widths of the through-holes opened in the air-blowing regions are equal to widths of the corresponding air-blowing regions.

7. The developing device according to claim 6, wherein the adjacent air-blowing regions are arranged with an interval there between, and the intervals amongst all the adjacent air-blowing regions are identical.

8. The developing device according to claim 4, wherein intervals amongst the adjacent air-blowing regions are equal to widths of the through-holes.

9. The developing device according to claim 1 wherein a temperature regulator is installed in the air supply pipeline, and the control unit changes air temperature in the corresponding air supply pipeline by controlling the temperature regulator.

* * * * *

UNITED STATES PATENT AND TRADEMARK OFFICE
CERTIFICATE OF CORRECTION

PATENT NO. : 12,411,423 B2  
APPLICATION NO. : 17/455705  
DATED : September 9, 2025  
INVENTOR(S) : Peng Dong Page 1 of 1

It is certified that error appears in the above-identified patent and that said Letters Patent is hereby corrected as shown below:

On the Title Page

Item (30), please correct Foreign Application Priority Data from:  
Jun. 8, 2020 (CN)......................... 202110510877.0  
To:  
Jun. 8, 2020 (CN)......................... 202010510877.0

Signed and Sealed this  
Fourteenth Day of October, 2025

John A. Squires  
*Director of the United States Patent and Trademark Office*